United States Patent
Inagaki et al.

(10) Patent No.: US 12,262,476 B2
(45) Date of Patent: Mar. 25, 2025

(54) MOUNTING DEVICE

(71) Applicant: FUJI CORPORATION, Chiryu (JP)

(72) Inventors: Mitsutaka Inagaki, Anjo (JP); Shigeto Oyama, Kariya (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 464 days.

(21) Appl. No.: 17/628,087

(22) PCT Filed: Jul. 19, 2019

(86) PCT No.: PCT/JP2019/028508
§ 371 (c)(1),
(2) Date: Jan. 18, 2022

(87) PCT Pub. No.: WO2021/014505
PCT Pub. Date: Jan. 28, 2021

(65) Prior Publication Data
US 2022/0322595 A1 Oct. 6, 2022

(51) Int. Cl.
*B23P 19/00* (2006.01)
*H05K 13/04* (2006.01)
*H05K 13/08* (2006.01)

(52) U.S. Cl.
CPC ....... *H05K 13/0812* (2018.08); *H05K 13/041* (2018.08); *H05K 13/0815* (2018.08)

(58) Field of Classification Search
CPC ............. H05K 13/041; H05K 13/0812; H05K 13/0815
See application file for complete search history.

(56) References Cited

U.S. PATENT DOCUMENTS

| 2004/0049758 A1* | 3/2004 | Ueda | H05K 13/0465 29/832 |
| 2006/0053624 A1* | 3/2006 | Maeda | H05K 13/0409 29/832 |

(Continued)

FOREIGN PATENT DOCUMENTS

| JP | 4-324999 A | 11/1994 |
| JP | 2000-13097 A | 1/2000 |

(Continued)

OTHER PUBLICATIONS

International Search Report mailed on Sep. 10, 2019 in PCT/JP2019/028508 filed on Jul. 19, 2019, 2 pages.

*Primary Examiner* — Paul D Kim
(74) *Attorney, Agent, or Firm* — Oblon, McClelland, Maier & Neustadt, L.L.P.

(57) ABSTRACT

A mounting device of the present disclosure used in a mounting system, includes a supply section configured to hold a component, a mounting section configured to pick up the component from the supply section and perform a mounting process for the component on a mounting target, an inspection/imaging section configured to capture an image of the mounting target, and a control section configured to execute a missing component inspection process of detecting whether a component on the mounting target is missing or not by using a captured image of the mounting target, and, when a component is missing, control the mounting section to pick up the missing component from the supply section and dispose the missing component on the mounting target.

9 Claims, 5 Drawing Sheets

(56) References Cited

U.S. PATENT DOCUMENTS

| | | |
|---|---|---|
| 2009/0000110 A1 | 1/2009 | Maenishi |
| 2010/0155106 A1* | 6/2010 | Britton ................. H05K 1/0269 |
| | | 29/829 |
| 2012/0162405 A1* | 6/2012 | Inagaki ............ G01N 21/95684 |
| | | 382/145 |
| 2016/0227683 A1* | 8/2016 | Nakajima .............. H05K 13/08 |
| 2018/0242485 A1 | 8/2018 | Kondo et al. |
| 2019/0045680 A1 | 2/2019 | Kondo |

FOREIGN PATENT DOCUMENTS

| | | |
|---|---|---|
| JP | 2007-158052 A | 6/2007 |
| JP | 2007-214212 A | 8/2007 |
| WO | WO 2015/040667 A1 | 3/2015 |
| WO | WO 2017/033268 A1 | 3/2017 |
| WO | WO 2017/141377 A1 | 8/2017 |

* cited by examiner

MOUNTING DEVICE

TECHNICAL FIELD

The present specification discloses a mounting device, a mounting system, and an inspection and mounting method.

BACKGROUND ART

In the conventional art, as an inspection device used in a mounting device, there has been proposed a device that executes missing component inspection and inspects a foreign object on a board from which a missing component is detected (refer to Patent Literature 1, for example). In this inspection device, the foreign object inspection is not performed on a board from which a missing component is not detected, whereas the foreign object inspection is preferentially performed on a board from which a missing component is detected with respect to the periphery of a position where the missing component is detected or a region where the component is moved. Thus, in this inspection device, it is possible to further suppress the occurrence of a defective board. As a mounting device, a device that exchanges feeders by using an exchange robot that is moved between a storage container that stores a feeder holding a component and a supply section that supplies a component has been proposed (refer to Patent Literature 2, for example). In this mounting device, feeders can be automatically exchanged by the exchange robot.

PATENT LITERATURE

Patent Literature 1: International Publication No. WO 2015/040667
Patent Literature 2: International Publication No. WO 2017/033268

BRIEF SUMMARY

Technical Problem

However, in the inspection device in Patent Literature 1 described above, although the foreign object inspection is considered, countermeasures against a missing component have not been sufficiently considered. Thus, in this inspection device, the production efficiency is not favorable, for example, an operator is required to perform an operation such as solving a missing component. In Patent Literature 2 described above, a missing component or a foreign object is not considered. As described above, it is desirable to execute production more efficiently in a system including a mounting device.

The present disclosure has been made in view of such problems, and a principal object thereof is to provide a mounting device, a mounting system, and an inspection and mounting method capable of more efficiently executing production.

Solution to Problem

The present disclosure employs the following means in order to achieve the above principal object.

According to the present disclosure, there is provided a mounting device used in a mounting system, the mounting device including a supply section configured to hold a component; a mounting section configured to pick up the component from the supply section and perform a mounting process for the component on a mounting target; an inspection/imaging section configured to capture an image of the mounting target; and a control section configured to execute a missing component inspection process of detecting whether a component on the mounting target is missing or not by using a captured image of the mounting target, and, when a component is missing, control the mounting section to pick up the missing component from the supply section and dispose the missing component on the mounting target.

In this mounting device, the missing component inspection process of detecting whether a component on the mounting target is missing or not is executed by using the captured image of the mounting target, and when a component is missing, the mounting section is controlled to pick up the missing component from the supply section and dispose the missing component on the mounting target. Since the mounting device has the configuration of executing the mounting process and the configuration of executing the inspection process, it is possible to remount the missing component after executing the missing component inspection. Therefore, it is possible to execute production more efficiently compared with a case where an operator executes an operation for a missing component.

DESCRIPTION OF EMBODIMENTS

Figure 1:
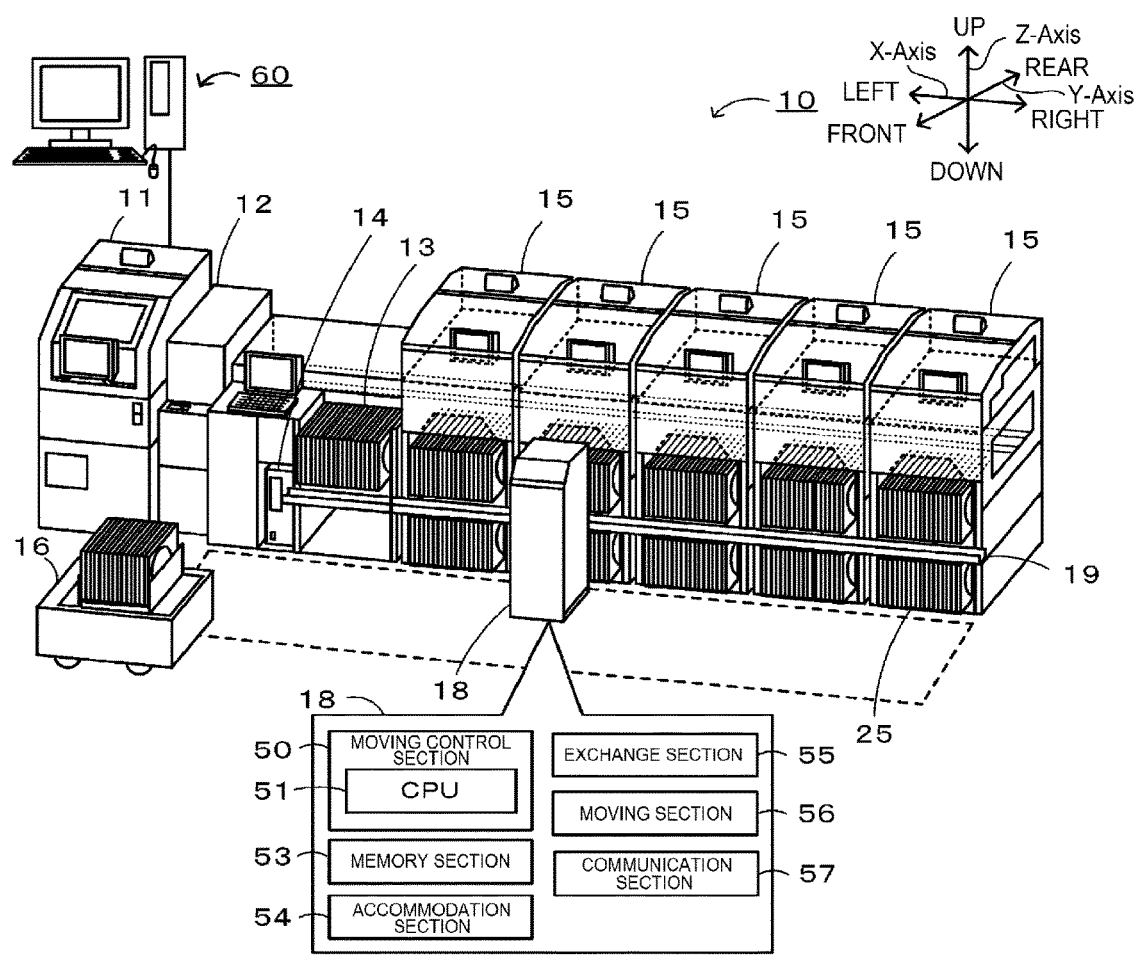
FIG. 1 is a schematic explanatory diagram illustrating an example of mounting system 10.
Figure 2:
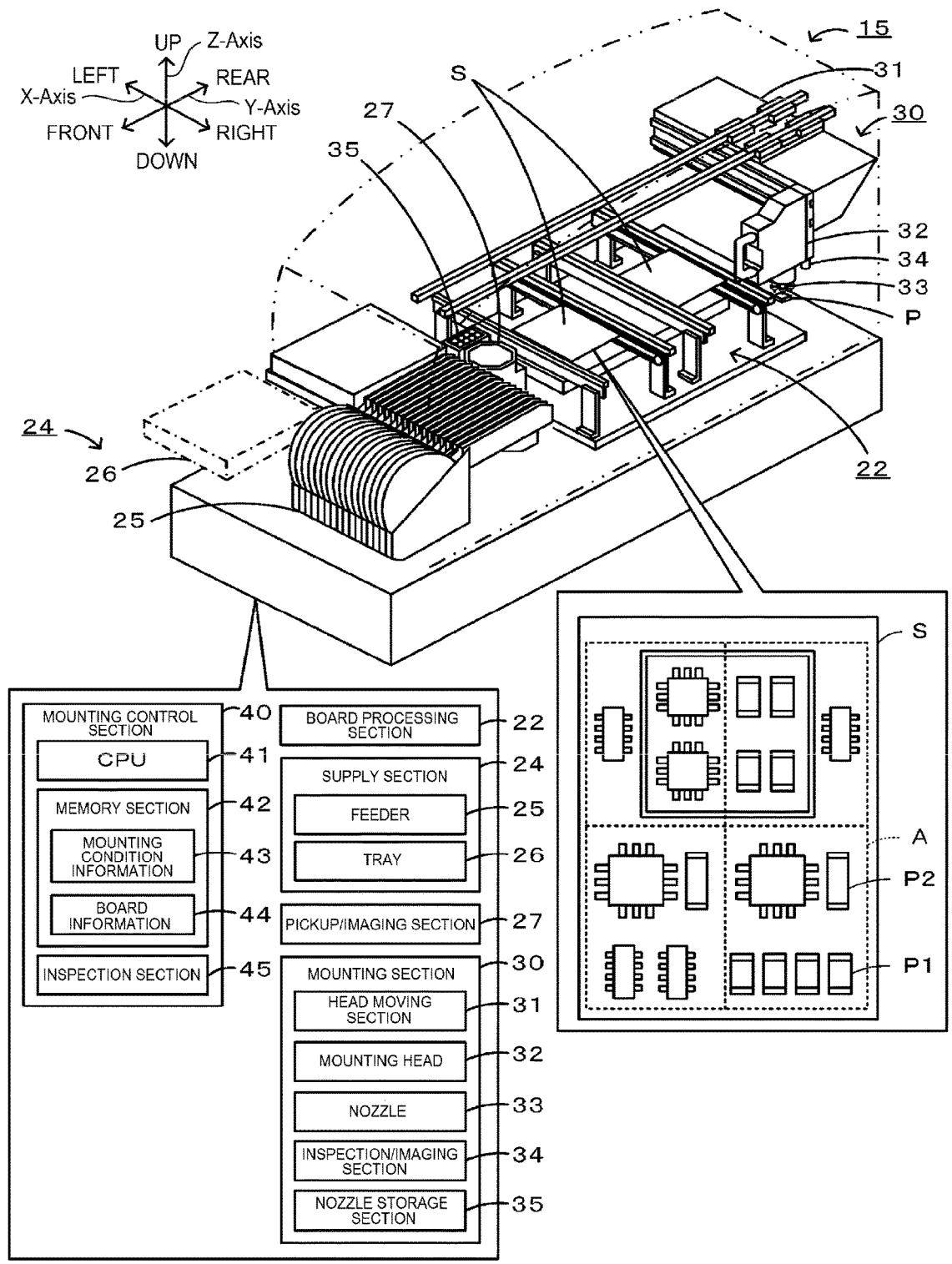
FIG. 2 is an explanatory diagram schematically illustrating configurations of mounting device 15 and board S.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating configurations of mounting device 15 and board S. In the present embodiment, a left-right direction (X-axis), a front-rear direction (Y-axis), and an up-down direction (Z-axis) are as illustrated in FIGS. 1 and 2.

Mounting system 10 is configured as, for example, a production line in which mounting devices 15 executing a mounting process for components P on board S serving as a mounting target are arranged in a conveyance direction of board S. Here, a mounting target is described as board S but is not particularly limited as long as component P is mounted thereon, and may be a substrate having a three-dimensional shape. As illustrated in FIG. 1, mounting system 10 is configured to include printing device 11, printing inspection device 12, storage section 13, management PC 14, mounting device 15, automatic conveyance vehicle 16, loader 18, host PC 60, and the like. Printing device 11 is a device that prints a solder paste or the like on board S. Printing inspection device 12 is a device that inspects a state of the printed solder.

Mounting device 15 is a device that picks up component P and mounts component P on board S. Mounting device 15 has a function of executing a mounting inspection process for inspecting whether a component on board S is missing or not or a state of a component disposed on board S. Mounting device 15 includes board processing section 22, supply section 24, pickup/imaging section 27, mounting section 30, and mounting control section 40. As illustrated in FIG. 2, mounting control section 40 is configured as a microprocessor centered on CPU 41, and controls the entire device. Mounting control section 40 includes memory section 42 and inspection section 45. Memory section 42 stores mounting condition information 43, board information 44, and the like. Mounting condition information 43 is a production job, and includes information such as information of component P, a disposition order in which component P is mounted on board S, a disposition position, an attachment position of feeder 25 from which component P is picked up, and the like. Board information 44 is information for managing the mounting state or the like of board S, and includes, for example, a picked-up state or an inspection result when component P is mounted, and a remounting result of a missing component. The missing component means that component P is not present on board S for some reason although a mounting process for component P is performed. Board information 44 is transmitted to host PC 60 and stored as a board information database for production management. Inspection section 45 is, for example, a functional block that inspects a state of board S or disposed component P based on an image obtained by imaging board S. Mounting control section 40 outputs control signals to board processing section 22, supply section 24, and mounting section 30, and also receives signals from board processing section 22, supply section 24, and mounting section 30.

Board processing section 22 is a unit that carries in, conveys, fixes at a mounting position, and carries out board S. Board processing section 22 has a pair of conveyor belts extending in the left-right direction and spaced apart from each other in the front-rear direction in FIG. 2. Board S is conveyed by these conveyor belts. Board processing section 22 includes two pairs of the conveyor belts, and can convey and fix two boards S simultaneously. Supply section 24 is a unit that supplies component P to mounting section 30. Supply section 24 attaches feeder 25 including a reel around which a tape serving as a holding member holding component P is wound to at least one attachment section. Feeder 25 includes a controller (not illustrated). The controller stores information such as an ID of the tape included in feeder 25, the type of component P, and the remaining number of components P. When feeder 25 is attached to the attachment section, the controller transmits information regarding feeder 25 to mounting control section 40. Supply section 24 includes a tray unit having tray 26 serving as a holding member on which multiple components P are arranged and placed.

Pickup/imaging section 27 is a device that captures images of one or more components P in a state of being picked up and held by mounting head 32. Pickup/imaging section 27 is disposed between board processing section 22 and supply section 24. An imaging range of pickup/imaging section 27 is located above pickup/imaging section 27. Pickup/imaging section 27 captures an image of component P when mounting head 32 holding component P passes over pickup/imaging section 27, and outputs the captured image to mounting control section 40. Based on the captured image, mounting control section 40 may execute, for example, inspection as to whether a shape and a part of component P are normal, or detection of a deviation amount of a position, rotation, or the like at the time of picking up component P.

Mounting section 30 is a unit that picks up component P from supply section 24 and disposes component P on board S fixed to board processing section 22. Mounting section 30 includes head moving section 31, mounting head 32, nozzle 33, inspection/imaging section 34, and nozzle storage section 35. Head moving section 31 includes a slider moved by being guided by guide rails in the XY-directions, and a motor that drives the slider. Mounting head 32 picks up one or more components P and is moved in the XY-directions by head moving section 31. Mounting head 32 is detachably attached to the slider. One or more nozzles 33 are detachably attached to a lower surface of mounting head 32. Nozzle 33 picks up component P by using a negative pressure. A pickup member that picks up component P may be a mechanical chuck or the like that mechanically holds component P in addition to nozzle 33. Inspection/imaging section 34 is a camera that captures an image of a region below mounting head 32, and captures an image of, for example, not only component P disposed on board S but also a reference mark, a 2D code, or the like formed on board S. Inspection/imaging section 34 is disposed on the lower surface side of the slider to which mounting head 32 is attached, and is moved in the XY-directions in accordance with the moving of mounting head 32. Inspection/imaging section 34 outputs the image data of multiple missing component inspection regions A (refer to FIG. 2) set on board S on which component P is disposed to mounting control section 40. Mounting control section 40 causes inspection section 45 to analyze the image data.

Storage section 13 is a storage location for temporarily storing feeder 25 used in mounting device 15. Storage section 13 is provided under a conveyance device between printing inspection device 12 and mounting device 15. Storage section 13 has an attachment section in the same manner as supply section 24. When feeder 25 is connected to the attachment section, the controller of feeder 25 transmits the information regarding feeder 25 to management PC 14. In storage section 13, feeder 25 may be transported by automatic conveyance vehicle 16, or feeder 25 may be transported by an operator. Management PC 14 is a device that manages feeder 25, stores execution data or the like executed by loader 18, and manages loader 18. Automatic conveyance vehicle 16 automatically conveys feeder 25, a member used in mounting system 10, and the like between a warehouse (not illustrated) and storage section 13. The warehouse stores feeder 25 and other members.

Loader 18 is a mobile work device, which is a device that is moved in a moving region in front of mounting system 10 (refer to dotted lines in FIG. 1), and automatically collects and provides members or the like necessary for a mounting process, such as feeder 25 of mounting device 15. Loader 18 includes moving control section 50, memory section 53, accommodation section 54, exchange section 55, moving section 56, and communication section 57. Moving control section 50 is configured as a microprocessor centered on CPU 51 and controls the entire device. Moving control section 50 controls the entire device such that feeder 25 is collected from supply section 24 or feeder 25 is provided to supply section 24, and feeder 25 is moved to and from storage section 13. Memory section 53 is, for example, an HDD that stores various data such as a processing program. Accommodation section 54 has an accommodation space for accommodating feeder 25. Accommodation section 54 is configured to be able to accommodate, for example, four feeders 25. Exchange section 55 is a mechanism that moves feeder 25 in and out as well as moving feeder 25 in the up-down direction. Exchange section 55 has a clamp section that clamps feeder 25, a Y-axis slider that moves the clamp section in the Y-axis direction (front-rear direction), and a Z-axis slider that moves the clamp section in the Z-axis direction (up-down direction). Exchange section 55 executes attachment and detachment of feeder 25 at mounting attachment section 28, and attachment and detachment of feeder 25 at buffer attachment section 29. Moving section 56 is a mechanism that moves loader 18 in the X-axis direction (the left-right direction) along X-axis rail 19 disposed in front of mounting device 15. Communication section 57 is an interface that performs exchange of information with external devices such as management PC 14 and mounting device 15. Loader 18 outputs the current position or details of executed work to management PC 14. Loader 18 is capable of collecting and providing feeder 25, but may be configured to collect and provide members related to the mounting process, such as mounting head 32, nozzle 33, a solder cartridge, a screen mask, and a backup pin for supporting a board.

Host PC 60 (refer to FIG. 1) is configured as a server that stores and manages information used by each device of mounting system 10, for example, a production planning data including multiple pieces of mounting condition information 43 and a board information database including multiple pieces of board information 44.

Figure 3:
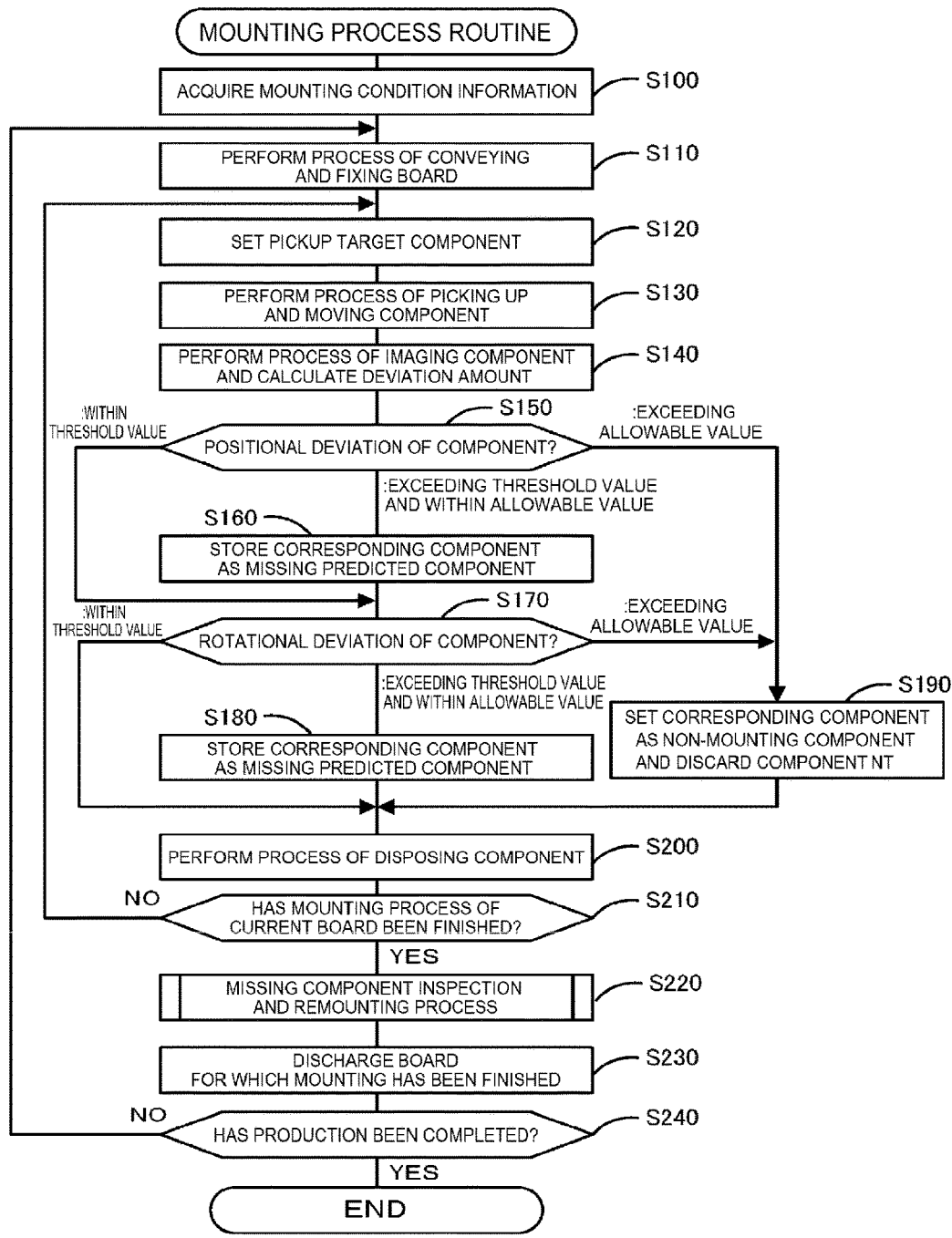
FIG. 3 is a flowchart illustrating an example of a mounting process routine.

Next, an operation of mounting system 10 according to the present embodiment configured as described above, first, a process in which mounting device 15 mounts component P on board S will be described. FIG. 3 is a flowchart illustrating an example of a mounting process routine executed by CPU 41 of mounting control section 40 of mounting device 15. This routine is stored in memory section 42 of mounting device 15 and executed in accordance with a starting instruction from an operator. When this routine is started, first, CPU 41 reads and acquires mounting condition information of board S to be produced this time (S100). CPU 41 reads mounting condition information 43 that is acquired from host PC 60 and stored in memory section 42. Next, CPU 41 causes board processing section 22 to convey board S to a mounting position and to perform a process of fixing board S (S110). Next, CPU 41 sets a component that is a pickup target based on mounting condition information 43 (S120), causes mounting head 32 to pick up component P from feeder 25 at a preset position and to move component P above pickup/imaging section 27 (S130).

Figure 4:
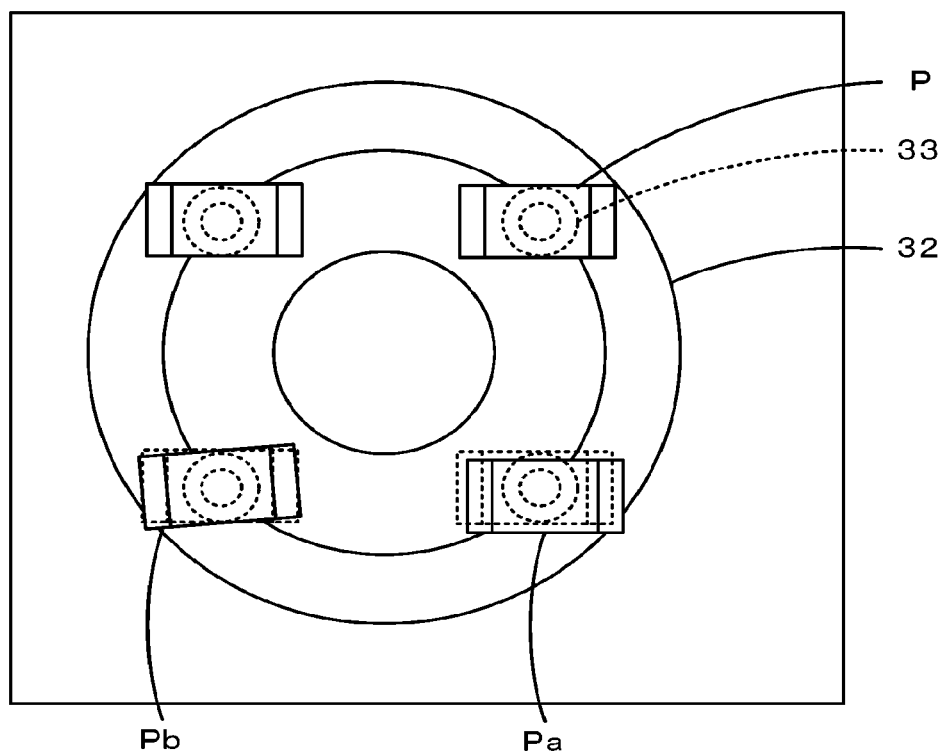
FIG. 4 is an explanatory diagram illustrating an example of mounting head 32 that has picked up component P.

Next, CPU 41 causes pickup/imaging section 27 to perform a process of imaging component P in the state of being picked up by mounting section 30, and calculates a deviation amount based on a reference position (S140). FIG. 4 is an explanatory diagram illustrating an example of mounting head 32 having picked up component P when viewed from the bottom. FIG. 4 illustrates an example in which mounting head 32 includes four nozzles 33. In FIG. 4, component P at the reference position is indicated by dotted lines. As illustrated in FIG. 4, a positional deviation in the XY-coordinate directions occurs in component Pa with respect to the reference position, and a rotational deviation in which the component is rotated with respect to the reference position to cause an inclination occurs in component Pb. As described above, in mounting section 30, a picked-up state of component P may be changed. When the deviation amount is calculated, CPU 41 checks whether the positional deviation amount of component P is within a threshold value, exceeds the threshold value and within an allowable value, or exceeds the allowable value (S150). In mounting device 15, a predetermined threshold value at which a probability of a missing component or the like occurring when exceeding a positional deviation amount of component P in a picked-up state of component P is increased is empirically determined, and an allowable value that is larger than the threshold value and at which a normal product cannot be obtained even if component P is disposed on board S when exceeding the threshold value is also empirically determined.

When the positional deviation amount of component P exceeds the threshold value and is within the allowable value in S150, CPU 41 stores component P as a missing predicted component in board information 44 (S160). In this case, CPU 41 stores a disposition position number of corresponding component P in association with information as the missing predicted component in board information 44 including identification information (ID) of board S After S160 or when the positional deviation amount of component P is within the threshold value in S150, CPU 41 checks whether the rotational deviation amount of component P is within the threshold value, exceeds the threshold value and within the allowable value, or exceeds the allowable value (S170). In mounting device 15, a predetermined threshold value at which a probability of a missing component or the like occurring when exceeding a rotational deviation amount in a picked-up state of component P is increased is empirically determined, and an allowable value that is larger than the threshold value and at which a normal product cannot be obtained even if component P is disposed on board S when exceeding the threshold value is also empirically determined.

When the rotational deviation amount of component P exceeds the threshold value and is within the allowable value in S170, corresponding component P is stored in board information 44 as a missing predicted component (S180). In this case, CPU 41 stores a disposition position number of corresponding component P in association with information as the missing predicted component in board information 44 including identification information (ID) of board S. As described above, the information obtained from an image captured by pickup/imaging section 27 and possibly leading to a defect thereafter is stored in board information 44. According to board information 44, it is possible to manage by which mounting device 15 component P mounted may be defective.

On the other hand, when the positional deviation amount of component P exceeds the allowable value in S150, or when the rotational deviation amount of component P exceeds the allowable value in S170, CPU 41 determines that a board on which component P is to be mounted will be a defective board, sets corresponding component P as a non-mounting component not used for a mounting process, and then performs a process of discarding component P (S190). In a case where mounting head 32 holds multiple components P, when there is a non-mounting component among components, CPU 41 discards the non-mounting component in a predetermined discarding location after disposing normal components P on board S. Components P instead of discarded components P may be collectively mounted at the end of the mounting process of mounting device 15.

After S190, after S180, or when the rotational deviation amount of component P is within the threshold value in S170, CPU 41 causes mounting section 30 to execute a process of disposing component P (S200). Subsequently, CPU 41 determines whether the mounting process for board S that is currently fixed to the mounting position has been finished (S210), and executes the processes in and after S120 when the mounting process has not been finished. That is, CPU 41 sets component P to be picked up and disposed next, causes mounting section 30 to pick up component P, stores missing predicted component information in board information 44 according to a state of component P, or executes a process of disposing component P on board S while discarding a non-mounting component (S120 to S200). On the other hand, when the mounting process for board S that is currently fixed to the mounting position is finished in S210, CPU 41 executes a missing component inspection and remounting process (S220). The missing component inspection and remounting process, which will be described later in detail, is a process of inspecting the presence or absence of a missing component on board S, and executing a remounting process for the corresponding component when a component is missing. After the missing component inspection and remounting process in S220 is executed, CPU 41 causes board processing section 22 to discharge board S for which the mounting has been finished (S230), and determines whether or not production of all boards S set in mounting condition information 43 has been completed (S240). When the production of all boards S has not been completed, CPU 41 executes the processes in and after S110, whereas when the production of all boards S has been completed, CPU 41 finishes this routine. Since such mounting process is executed by each of mounting devices 15, information regarding a position where a missing predicted component is present in specific board S is integrated and stored in board information 44.

Figure 5:
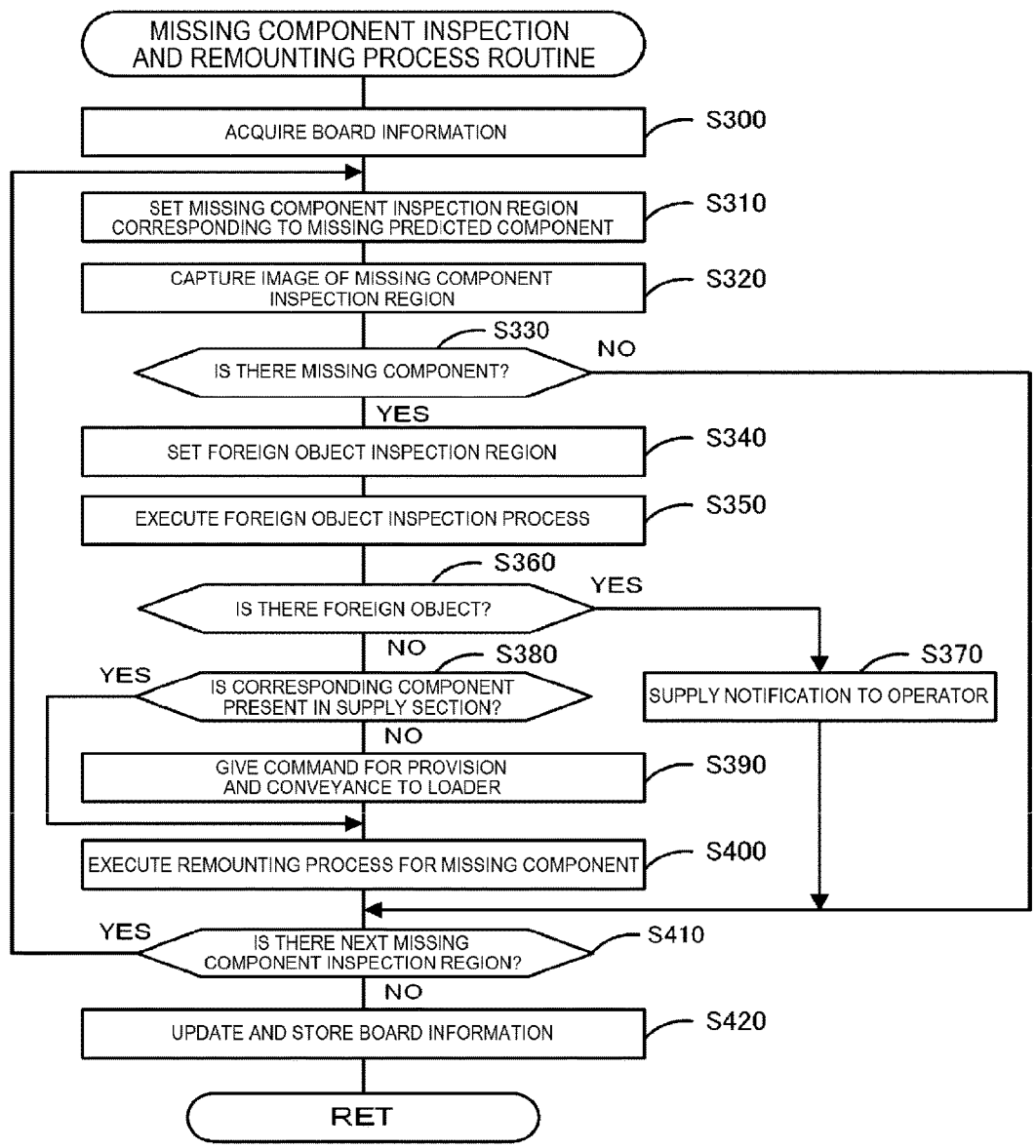
FIG. 5 is a flowchart illustrating an example of a missing component inspection and remounting process routine.

Here, the missing component inspection and remounting process in S220 will be described. FIG. 5 is a flowchart illustrating an example of the missing component inspection and remounting process routine. This routine is stored in memory section 42 of mounting device 15, and is executed in S220 of the mounting process routine after the mounting process in current mounting device 15 is finished. When this routine is started, first, CPU 41 reads and acquires board information 44 of board S which is fixed to board processing section 22 and for which a mounting process in mounting device 15 is finished (S300). Next, in S310, CPU 41 sets missing component inspection region A corresponding to the missing predicted component. CPU 41 may determine whether or not there is a missing predicted component in entire missing component inspection region A of board S on which the inspection is executed by mounting device 15, and may omit the missing component inspection process without setting missing component inspection region A when there is no missing predicted component. In this case, when there is a missing predicted component, CPU 41 may set a region including a disposition region in which the missing predicted component is disposed as missing component inspection region A, and execute the missing component inspection process. In this mounting device 15, since the missing component inspection process is executed only on a region where a missing component may occur, it is possible to further reduce the inspection time.

Next, CPU 41 causes inspection/imaging section 34 to perform a process of imaging set missing component inspection region A (S320). CPU 41 controls head moving section 31 to move inspection/imaging section 34 onto missing component inspection region A of board S, and causes inspection/imaging section 34 to image missing component inspection region A. Next, CPU 41 determines whether or not a component is missing in a captured image by using a reference image captured when component P is appropriately disposed (S330). When a component is missing in imaged missing component inspection region A, a foreign object inspection region corresponding to a position of the missing component is set (S340), and a foreign object inspection process of inspecting a foreign object on board S is executed (S350). This foreign object inspection process is inspection because a component that has missed is present as a foreign object anywhere in board S, so that a defective board will not be manufactured. The setting of the foreign object inspection region may be, for example, a region around the missing component position where the presence of the foreign object adversely affects board manufacturing. For example, the foreign object inspection region may be set to a region where component P is not currently disposed and component P is disposed by next mounting device 15 or after, a disposition region of component P having a special shape in which component P that is missing enters a lower part of already disposed component P, a disposition region of an expensive component, or the like. For example, in a region where component P is not disposed has a low possibility that a defective board will occur due to the presence of a foreign object, the foreign object inspection may be omitted. The foreign object inspection process may be performed, for example, by capturing an image of set missing component inspection region A with inspection/imaging section 34, and comparing the captured image with an image obtained by appropriately disposing component P on board S.

Subsequently, CPU 41 determines whether or not there is a foreign object in missing component inspection region A (S360), and notifies the operator of the presence of the foreign object (S370). The operator may be notified, for example, by displaying a message indicating the presence of the foreign object on the operation panel or outputting a sound. In this case, CPU 41 may temporarily stop the operation of mounting device 15, obtain an input for restart from the operator, and then perform the processes in and after S370. On the other hand, when there is no foreign object in missing component inspection region A in S360, CPU 41 executes a remounting process for component P that is the missing component (S380 to S400). In the remounting process, CPU 41 determines whether or not component P that is the missing component is held in feeder 25 or tray 26 and is present in supply section 24 (S380), and outputs a command for causing loader 18 to provide and convey component P when there is no corresponding component P in supply section 24 (S390). For example, in FIG. 2, when component P1 is a component mounted by this mounting device 15, component P1 is substantially present in supply section 24. On the other hand, when component P2 is mounted before this mounting device 15, component P2 may not be present in supply section 24. In this case, for example, CPU 41 causes loader 18 to provide component P2 in storage section 13 to supply section 24. Component P in storage section 13 is managed by management PC 14, so that whether or not missing component P is present in storage section 13 may be ascertained from the management information of management PC 14. When there is no corresponding component P in storage section 13, CPU 41 may cause automatic conveyance vehicle 16 to convey corresponding component P to storage section 13. After outputting the command in S390, CPU 41 waits until component P is conveyed to supply section 24, and executes the following processes after component P is conveyed to supply section 24. When this command is received, loader 18 moves feeder 25 or tray 26 holding corresponding component P from storage section 13 to mounting device 15 for which an instruction is given.

After S390 or when missing component P is present in supply section 24 in S380, CPU 41 causes mounting section 30 to execute a remounting process for missing component P (S400). In the remounting process, CPU 41 causes mounting head 32 to pick up corresponding component P from supply section 24, and moves component P to a position of the missing component ascertained in S330 and disposes component P. Nozzle 33 for picking up missing component P may be predicted in advance, stored in nozzle storage section 35 of mounting section 30, or may be moved from storage section 13 by loader 18. Mounting head 32 is also the same as nozzle 33. As described above, since mounting device 15 has the function of the inspection device and the function of the mounting device, it is possible to easily remount component P that is a missing component after the missing component inspection is performed.

After S400, after S370, or when no component is missing in missing component inspection region A in S330, CPU 41 determines whether or not there is next missing component inspection region A (S410), and executes the processes in and after S310 when there is next missing component inspection region A. That is, CPU 41 sets next missing component inspection region A in S310, performs the missing component inspection process, and executes the foreign object inspection process or the remounting process as necessary. On the other hand, when there is no next missing component inspection region A in S410, that is, when all the missing component inspections are executed, information regarding details of the executed processes is included in board information 44, updated, and stored in memory section 42 (S420), and this routine is finished.

Here, correspondence relationships between configuration element of the present embodiment and configuration element of the present disclosure will be clarified. Supply section 24 of the present embodiment corresponds to a supply section, mounting section 30 corresponds to a mounting section, inspection/imaging section 34 corresponds to an inspection/imaging section, mounting control section 40 corresponds to a control section, feeder 25 and tray 26 correspond to a holding member, nozzle 33 and the mechanical chuck correspond to a pickup member, and pickup/imaging section 27 corresponds to pickup/imaging section. In the present embodiment, an example of the inspection and mounting method of the present disclosure is also clarified by describing the operation of mounting device 15.

In mounting device 15 of the present embodiment described above, the missing component inspection process of detecting whether a component P on board S is missing or not is executed by using a captured image of board S serving as a mounting target, and when component P is missing, mounting section 30 is controlled to pick up missing component P from supply section 24 and dispose component P on board S. Since mounting device 15 has a configuration for executing the mounting process and a configuration for executing the inspection process, it is possible to remount this missing component P after executing the missing component inspection. Therefore, it is possible to execute production more efficiently compared with a case where an operator executes an operation for a missing component. Mounting system 10 includes multiple mounting devices 15, and CPU 41 executes the missing component inspection process on board S on which the mounting process is performed by other mounting device 15, and controls mounting section 30 to pick up missing component P that should have been mounted by other mounting device 15 from supply section 24 and dispose missing component P on board S when component P is missing. In this mounting device 15, since missing component P that should have been mounted by other mounting device 15 can also be remounted, production can be executed more efficiently.

Supply section 24 is provided with feeder 25 or tray 26 as a holding member that holds component P, and mounting system 10 further includes loader 18 as a mobile work device including accommodation section 54 that accommodates feeder 25 or the like to collect feeder 25 from supply section 24 and/or to attach feeder 25 or the like to supply section 24. In this case, when component P on board S is missing and missing component P is not present in supply section 24, CPU 41 moves feeder 25 holding the missing component to the supply section by loader 18. In this mounting device 15, even in a case where component P mounted by other mounting device 15 is not present in mounting device 15, component P can be secured, and thus production can be executed more reliably and efficiently. When component P on board S is missing and nozzle 33 serving as a pickup member that picks up missing component P is not in mounting section 30, CPU 41 causes loader 18 to move nozzle 33 for picking up this missing component P to mounting section 30. In this mounting device 15, even in a case where a pickup member for picking up component P mounted by other mounting device 15 is not present in this mounting device 15, component P can be picked up, and thus production can be executed more reliably and efficiently.

CPU 41 executes the missing component inspection process by using a captured image of component P captured by inspection/imaging section 34 and in a state in which component P is picked up by mounting section 30. In this mounting device 15, it is possible to execute production more efficiently by using a captured image of component P in a picked-up state. CPU 41 executes the missing component inspection process on a disposition region in which component P for which a value of a rotational position as a pickup position or a pickup posture of component P obtained from the captured image of component P in a state of being picked up by mounting section 30 exceeds a predetermined threshold value is disposed. In mounting device 15, since a region where the missing component inspection process is executed is specified based on the picked-up state of component P, the production can be executed more efficiently by executing the missing component inspection process more efficiently. CPU 41 acquires, from board information 44, information regarding a pickup position or a pickup posture of component P obtained based on a captured image that is captured by pickup/imaging section 27 of other mounting device 15, and executes the missing component inspection process. In this mounting device 15, production can be executed more efficiently by executing the missing component inspection process by using information obtained by other mounting devices 15.

When component P on board S is missing, CPU 41 executes the foreign object inspection process for detecting a foreign object present on board S. In mounting device 15, the production can be executed more efficiently by executing the foreign object inspection process only when component P is missing. CPU 41 executes the foreign object inspection process on some or all of regions where component P is mounted on board S. In mounting device 15, production can be executed more efficiently by executing the foreign object inspection process only on a region related to component mounting. Since CPU 41 executes the foreign object inspection process on a region where component P is mounted in the subsequent mounting process, a disposition region of a component having a special shape in which a missing component is embedded, or a disposition region of an expensive component, it is possible to further suppress the occurrence of a defective board, an increase in production cost, or the like.

Needless to say, the present disclosure is not limited to the embodiment that has been described, and can be carried out in various forms without departing from the technical scope of the present disclosure.

For example, in the above embodiment, the missing component inspection process is executed on component P of board S that has been subjected to the mounting process by other mounting device 15; however, the configuration is not particularly limited to this, and the missing component inspection process may be performed on only component P that has been subjected to the mounting process by current mounting device 15. In this mounting device 15, since component P is inevitably present in mounting section 30, it is easy to perform the remounting process. Loader 18 conveys component P when there is no component P to be remounted; however, the configuration is not particularly limited to this, and loader 18 may be omitted, and component P may be conveyed by automatic conveyance vehicle 16 or may be conveyed by an operator.

In the above embodiment, pickup/imaging section 27 captures an image in a state in which component P is picked up by mounting head 32 and executes the missing component inspection process by using the captured image; however, the configuration is not particularly limited to this, and the missing component inspection process may be executed without using a deviation amount obtained by using the captured image from pickup/imaging section 27. In particular, CPU 41 may execute the missing component inspection process on all the regions of board S. Similarly, in the above embodiment, the foreign object inspection region is set and the foreign object inspection process is performed only on that region; however, the configuration is not particularly limited to this, and the foreign object inspection process may be executed on all the regions of board S. This mounting device 15 requires an inspection time but can execute more reliable missing component inspection and foreign object inspection.

In the above embodiment, the present disclosure is described as mounting system 10 or mounting device 15, but may be a control method for mounting device 15 or a program for realizing the control method for mounting device 15.

Here, the mounting device, the mounting system, and the inspection and mounting method of the present disclosure may be configured as follows. For example, in the mounting device according to the present disclosure, the mounting system may include the multiple mounting devices, the control section may execute the missing component inspection process on the mounting target that has been subjected to a mounting process by other mounting device, and when a component is missing, control the mounting section to pick up the missing component that should have been mounted by the other mounting device from the supply section and dispose the missing component on the mounting target. In this mounting device, since a missing component that should have been mounted by other mounting device can also be remounted, production can be executed more efficiently.

In the mounting device according to the present disclosure used in the mounting system including the multiple mounting devices, the supply section may be provided with a holding member holding the component, and the mounting system may further include a mobile work device including an accommodation section that accommodates the holding member to collect the holding member from the supply section and/or to move the holding member to the supply section, and the control section may cause the mobile work device to move the holding member holding a missing component to the supply section when a component on the mounting target is missing and the missing component is not present in the supply section. In this mounting device, even in a case where a component mounted by other mounting device is not present in the mounting device, the component can be secured, and thus production can be executed more reliably and efficiently.

In the mounting device according to the present disclosure used in the mounting system including the multiple mounting devices, the mounting section may be able to attach and detach a pickup member that picks up the component, the supply section may be provided with a holding member holding the component, the mounting system may further include a mobile work device including an accommodation section that accommodates the holding member to collect the holding member from the supply section and/or to move the holding member to the supply section, and the control section may cause the mobile work device to move the pickup member that picks up a missing component to the mounting section when a component on the mounting target is missing and the pickup member that picks up the missing component is not present in the mounting section. In this mounting device, even in a case where the pickup member that picks up a component mounted by other mounting device is not present in the mounting device, the component can be picked up, and thus production can be executed more reliably and efficiently.

The mounting device of the present disclosure may include a pickup/imaging section that captures an image of the component in a state of being picked up by the mounting section, and the control section may execute the missing component inspection process by using the captured image of the component in a state of being picked up by the mounting section. In this mounting device, it is possible to execute production more efficiently by using the captured image of the component in a picked-up state.

In the mounting device of the present disclosure including the pickup/imaging section, when the captured image of the component in a state of being picked up by the mounting section is used, the control section may execute the missing component inspection process on a disposition region in which the component for which a value of a pickup position and/or a pickup posture of the component obtained from the captured image exceeds a predetermined threshold value is disposed. In this mounting device, since the region for executing the missing component inspection process is specified based on the picked-up state of the component, it is possible to execute production more efficiently by executing the missing component inspection process more efficiently.

In the mounting device of the present disclosure including the pickup/imaging section, the mounting system may include the multiple mounting devices, and the control section may acquire information regarding the pickup position and/or the pickup posture of the component based on the captured image that is captured by the pickup/imaging section of other mounting device, and execute the missing component inspection process. In this mounting device, production can be executed more efficiently by executing the missing component inspection process by using the information obtained by other mounting device.

The control section may control the inspection/imaging section to execute a foreign object inspection process for detecting a foreign object present on the mounting target when a component on the mounting target is missing. In this mounting device, production can be executed more efficiently by executing the foreign object inspection process only when a component is missing. In this case, the control section may execute the foreign object inspection process on some or all of regions where components are mounted on the mounting target. In this mounting device, production can be executed more efficiently by executing the foreign object inspection process only on a region related to component mounting. In this case, the control section may execute the foreign object inspection process on a region where a component is to be mounted in the subsequent mounting process, a disposition region where a component having a special shape is disposed, or a disposition region where an expensive component is disposed.

The mounting system of the present disclosure includes any of the mounting devices described above. Since the mounting system has any of the mounting devices described above, it is possible to achieve the same effects.

The inspection and mounting method of the present disclosure is a method used in a mounting system having a mounting device including a supply section that holds a component, a mounting section that picks up the component from the supply section and performs a mounting process for the component on a mounting target, and an inspection/imaging section that captures an image of the mounting target, the inspection and mounting method including: (a) a step of executing a missing component inspection process of detecting whether a component on the mounting target is missing or not by using a captured image of the mounting target; and (b) a step of, when a component is missing in the step (a), controlling the mounting section to pick up the missing component from the supply section and dispose the missing component on the mounting target.

In this inspection and mounting method, similarly to the mounting device described above, since it is possible to remount missing component P after the missing component inspection is executed, it is possible to more efficiently execute the production. The inspection and mounting method may employ the aspect of the mounting device described above, or may include a step of expressing the function of the mounting device described above.

INDUSTRIAL APPLICABILITY

The mounting device, the mounting system, and the inspection and mounting method of the present disclosure can be used in electronic component mounting fields.

REFERENCE SIGNS LIST

10 Mounting system, 11 Printing device, 12 Printing inspection device, 13 Storage section, 14 Management PC, 15 Mounting device, 16 Automatic conveyance vehicle, 18 Loader, 19 X-axis rail, 22 Board processing section, 24 Supply section, 25 Feeder, 26 Tray, 27 Pickup/imaging section, 30 Mounting section, 31 Head moving section, 32 Mounting head, 33 Nozzle, 34 inspection/imaging section, 35 Nozzle storage section, 40 Mounting control section, 41 CPU, 42 Memory section, 43 Mounting condition information, 44 Board information, 45 Inspection section, 50 Moving control section, 51 CPU, 53 Memory section, 54 Accommodation section, 55 Exchange section, 56 Moving section, 57 Communication section, 60 Host PC, A Missing component inspection region, P, Pa, Pb, P1, P2 Component, S Board

The invention claimed is:

1. A mounting device used in a mounting system, the mounting device comprising:
   a supply section configured to hold a component;
   a mounting section configured to pick up the component from the supply section and perform a mounting process for the component on a mounting target;
   a camera configured to capture an image of the mounting target from above;
   a pickup/imaging section configured to capture an image of the component from below in a state of being picked up by the mounting section; and
   a control section configured to
      execute a missing predicted component process of determining a missing predicted component by using the image of the component in the state of being picked up by the mounting section captured by the pickup/imaging section,
      execute a missing component inspection process of detecting whether the missing predicted component on the mounting target is a missing component or not by using the image of the mounting target captured by the camera, and
      when the missing predicted component is missing, execute a remounting process to control the mounting section to pick up the missing component from the supply section and dispose the missing component on the mounting target.

2. The mounting device according to claim 1, wherein the mounting system includes multiple mounting devices, and
   the control section executes the missing component inspection process on the mounting target that has been subjected to a mounting process by other mounting device, and when a component is missing, controls the mounting section to pick up the missing component that should have been mounted by the other mounting device from the supply section and dispose the missing component on the mounting target.

3. The mounting device according to claim 2, wherein the supply section is provided with a holding member holding the component,
   the mounting system further includes a mobile work device including an accommodation section configured to accommodate the holding member to collect the holding member from the supply section and/or to move the holding member to the supply section, and
   the control section causes the mobile work device to move the holding member holding the missing component to the supply section when a component on the mounting target is missing and the missing component is not present in the supply section.

4. The mounting device according to claim 2, wherein the mounting section is configured to attach and detach a pickup member that picks up the component,
   the supply section is provided with a holding member holding the component,
   the mounting system further includes a mobile work device including an accommodation section configured to accommodate the holding member to collect the holding member from the supply section and/or to move the holding member to the supply section, and
   the control section causes the mobile work device to move the pickup member that picks up the missing component to the mounting section when a component on the mounting target is missing and the pickup member that picks up the missing component is not present in the mounting section.

5. The mounting device according to claim 1, wherein when the captured image of the component in the state of being picked up by the mounting section is used, the control section executes the missing component inspection process on a disposition region in which a component for which a value of a pickup position and/or a pickup posture of the component obtained from the captured image exceeds a predetermined threshold value is disposed.

6. The mounting device according to claim 1, wherein the mounting system includes multiple mounting devices, and
the control section acquires information regarding a pickup position and/or a pickup posture of the component based on the captured image that is captured by the pickup/imaging section of other mounting device, and executes the missing component inspection process.

7. The mounting device according to claim 1, wherein the control section further controls the camera to execute a foreign object inspection process of detecting a foreign object present on the mounting target when a component on the mounting target is missing.

8. The mounting device according to claim 7, wherein the control section executes the foreign object inspection process on some or all regions in which components are mounted on the mounting target.

9. A mounting system comprising the mounting device according to claim 1.

* * * * *